(12) United States Patent
Roggendorf (10) Patent No.: US 12,431,279 B2
(45) Date of Patent: Sep. 30, 2025

(54) ELECTRICAL ARRANGEMENT WITH A TRANSFORMER FOR TRANSMITTING SIGNALS FROM A PRIMARY SIDE TO A SECONDARY SIDE

(71) Applicant: WAGO Verwaltungsgesellschaft mit beschrankter Haftung, Minden (DE)

(72) Inventor: Roman Roggendorf, Bad Oeynhausen (DE)

(73) Assignee: WAGO Verwaltungsgesellschaft mit beschrankter Haftung, Minden (DE)

( * ) Notice: Subject to any disclaimer, the term of this patent is extended or adjusted under 35 U.S.C. 154(b) by 845 days.

(21) Appl. No.: 17/376,966

(22) Filed: Jul. 15, 2021

(65) Prior Publication Data
US 2022/0020525 A1  Jan. 20, 2022

(30) Foreign Application Priority Data

Jul. 15, 2020 (DE) ...................... 10 2020 118 708.4

(51) Int. Cl.
*H01F 27/28* (2006.01)
*H05K 1/02* (2006.01)
*H05K 1/18* (2006.01)

(52) U.S. Cl.
CPC ..... *H01F 27/2804* (2013.01); *H01F 27/2885* (2013.01); *H05K 1/0218* (2013.01); *H05K 1/18* (2013.01); *H01F 2027/2809* (2013.01); *H05K 2201/1003* (2013.01)

(58) Field of Classification Search
CPC ............. H01F 27/2804; H01F 27/2885; H01F 2027/2809; H01F 2027/2819; H01F 27/361; H01F 27/363; H01F 27/366; H05K 1/0218; H05K 1/18; H05K 2201/1003; H05K 2201/086; H05K 1/165
See application file for complete search history.

(56) References Cited

U.S. PATENT DOCUMENTS 6,380,836 B2 * 4/2002 Matsumoto ........... H02M 3/335
336/200
7,042,323 B2 * 5/2006 Joerg ...................... H01F 19/08
336/212

(Continued)

FOREIGN PATENT DOCUMENTS

DE           631445        5/1936
DE   10 2010 014 281 A1  10/2011

(Continued)

*Primary Examiner* — Mang Tin Bik Lian
(74) *Attorney, Agent, or Firm* — Workman Nydegger (57) ABSTRACT

Provided is an electrical arrangement with a printed circuit board built up in parallel layers, comprising a shield, a transformer for transmitting signals from a primary side to a secondary side, the transformer having a first coil winding and a second coil winding and a third coil winding, the first coil winding forming the primary side of the transformer and the second and third coil windings forming the secondary side of the transformer, and a magnetic conductor, wherein the circuit board has openings which are penetrated by parts of the magnetic conductor, and the magnetic conductor and the shield and the transformer are magnetically coupled, and wherein the shield is a potential-free shield.

21 Claims, 5 Drawing Sheets

(56) References Cited

U.S. PATENT DOCUMENTS

| | | | |
|---|---|---|---|
| 2005/0110606 A1* | 5/2005 | Vinciarelli | H01F 27/2804 336/200 |
| 2008/0247195 A1* | 10/2008 | Nakahori | H02M 7/003 363/20 |
| 2008/0278275 A1* | 11/2008 | Fouquet | H01F 27/2804 336/200 |
| 2009/0115564 A1* | 5/2009 | Minteer | H01F 27/36 336/200 |
| 2009/0295528 A1* | 12/2009 | Silva | H01F 3/14 336/200 |
| 2012/0206060 A1* | 8/2012 | Beyer | H01F 27/2804 336/171 |
| 2013/0057164 A1* | 3/2013 | Gruber | H01F 27/2804 336/182 |
| 2016/0227681 A1* | 8/2016 | Miller | H05K 9/003 |
| 2017/0200552 A1* | 7/2017 | Chung | H01F 27/2885 |
| 2018/0342349 A1* | 11/2018 | Mao | H01F 27/363 |
| 2019/0355506 A1* | 11/2019 | Fei | H01F 27/2804 |
| 2020/0296821 A1* | 9/2020 | Trublowski | H05K 1/181 |
| 2020/0343037 A1* | 10/2020 | Chen | H01F 27/363 |
| 2021/0274656 A1* | 9/2021 | Xiong | H05K 1/144 |

FOREIGN PATENT DOCUMENTS

| | | |
|---|---|---|
| DE | 10 2016 212 827 A1 | 1/2017 |
| EP | 1 391 900 A1 | 2/2004 |
| JP | 06-120053 * | 4/1994 |

* cited by examiner

ELECTRICAL ARRANGEMENT WITH A TRANSFORMER FOR TRANSMITTING SIGNALS FROM A PRIMARY SIDE TO A SECONDARY SIDE

FIELD

The present invention relates to an electrical arrangement with a transformer for transmitting signals from a primary side of the transformer to a secondary side of the transformer. In particular, the present invention relates to an electrical arrangement with a first coil winding, which forms a primary side of the transformer, and a second coil winding and a third coil winding, which form the secondary side of the transformer, and a shield.

BACKGROUND

Signal transmitters can be implemented using different designs. For example, a signal transmitter may have primary and secondary winding(s) which enclose one or more ferrite cores and are arranged next to one another or one above the other. Depending on the configuration, the susceptibility of the signal carrier to interference can differ, and the signal carrier can, depending on usage and/or positioning, be exposed to different kinds of interference (regarding type and strength).

DISCLOSURE OF THE INVENTION

An electrical arrangement according to the invention comprises a printed circuit board built up in parallel layers, comprising a potential-free shield, a transformer for transmitting signals from a primary side to a secondary side, wherein the transformer has a first coil winding and a second coil winding and a third coil winding, the first coil winding forming the primary side of the transformer and the second and third coil windings forming the secondary side of the transformer, and a magnetic conductor, wherein the circuit board has openings which are penetrated by parts of the magnetic conductor, and the magnetic conductor and the shield and the transformer are magnetically coupled.

In this regard, the term "electrical arrangement", as used throughout the description and the claims, is to be understood, in particular, as referring to a combination of electrical components which form a functional unit. Furthermore, the term "printed circuit board", as used throughout the description and the claims, is to be understood, in particular, as referring to a board made of an insulating material which is provided with conductive tracks, on which electrical and/or electronic components can be arranged, wherein the components are electrically connected to one another through the conductive tracks.

In this regard, the term "(circuit board) layers", as used throughout the description and the claims, is to be understood, in particular, as referring to different depth levels of a circuit board. Different circuit board layers may, for example, comprise horizontally running tracks which can be connected via vertical connecting channels that are provided with a conductive material. Furthermore, (planar) electrical components may be arranged between different circuit board layers, which are thus limited in the vertical direction (upwards and downwards) by the circuit board layers and are thus protected from damage (and are also stabilized).

Furthermore, the term "transformer", as used throughout the description and the claims, is to be understood, in particular, as referring to a component for the transmission of electrical signals by means of inductively coupled coils. In this context, a "signal" is to be understood, in particular, as a purposeful change in a voltage and/or a current or a voltage curve and/or a current curve that can or will be evaluated on the receiver side.

Furthermore, the term "winding", as used throughout the description and the claims, is to be understood, in particular, as referring to an electrical conductor (for example a metal wire) winding around an axis. Furthermore, the term "shield", as used throughout the description and the claims, is to be understood, in particular, as referring to a component that is provided to reduce interference on the transformer (and interference from the transformer on adjacent components).

Furthermore, the term "coil winding", as used throughout the description and the claims, is to be understood, in particular, as referring to a winding which is provided to generate or detect a magnetic field. In this context, the term "primary side", as used throughout the description and the claims, is to be understood, in particular, as referring to an energy-emitting side and the term "secondary side", as used throughout the description and the claims, is to be understood, in particular, as referring to an energy-absorbing side of the transformer.

Furthermore, the term "magnetic conductor", as used throughout the description and the claims, is to be understood, in particular, as referring to a component made of a (ferromagnetic) material with relatively high magnetic permeability, for example, a component made of a material with a permeability number higher than 10, preferably higher than 100, and particularly preferably higher than 1000 (e.g., a ferrite core).

Furthermore, the wording "openings which are penetrated by parts of the magnetic conductor", as used throughout the description and the claims, is to be understood, in particular, as referring to an arrangement in which parts (for example columns) of the magnetic conductor extend through the printed circuit board. In addition, the wording "magnetically coupled", as used throughout the description and the claims, is to be understood as referring to an arrangement in which an interaction is achieved between the coupled elements, mediated by a magnetic field.

The shield may be a shield winding.

In this regard, the term "shield winding" as used throughout the description and the claims, is to be understood, in particular as referring to an electrical conductor that winds around a point (e.g. a spiral metal wire, a planar curved conductor track, etc.), wherein the conductor is intended to reduce interference on the transformer (and interference from the transformer on adjacent components).

The second coil winding and the third coil winding may be arranged side-by-side in a first circuit board layer.

In this regard, the term "side-by-side", as used throughout the description and the claims, is to be understood, in particular, as referring to an arrangement in which the windings are coplanar.

The first coil winding may be arranged in a second circuit board layer.

The first circuit board layer and the second circuit board layer may be immediately adjacent to each other.

The shield may be arranged in a third circuit board layer.

Alternatively, a first part of the shield may be arranged in the third circuit board layer and a second part of the shield may be arranged in a fourth circuit board layer. The two shield parts may be electrically connected to one another through the first and/or second circuit board layer.

The third layer may be immediately adjacent to the second or first circuit board layer.

The fourth circuit board layer may also be immediately adjacent to the second or first circuit board layer.

In this regard, the wording "immediately adjacent", as used throughout the description and the claims, is not to be understood to mean that the conductive tracks or components in the layers must contact each another. Rather, said formulation is to be understood to mean that no further conductive tracks and/or components may be arranged between the conductive tracks and/or components of the immediately adjacent layers, although an insulation layer may be.

The circuit board may have a top layer that may be equipped with components and/or a bottom layer that may be equipped with components, wherein the components interact electrically and/or magnetically with the transformer.

The components may at least partially overlap with the transformer in a projection perpendicular to the parallel layers.

The coil windings may enclose one or more of the openings.

For example, the coil windings may enclose three openings in the circuit board.

The centers of the three openings in the circuit board may lie on a connecting line.

In this regard, the term "center" as used throughout the description and the claims, is to be understood, in particular, as referring to a point which exhibits a minimum with regard to the square of its distance to the edge of the opening integrated over the edge of the opening.

The magnetic conductor may comprise two parts extending in parallel to the connecting line.

The centers of the three openings in the circuit board may form an isosceles or equilateral triangle.

The shield may be a completely closed metallic ring.

In this regard, the term "completely closed metallic ring", as used throughout the description and the claims, is to be understood, in particular, as referring to an arrangement in which a metallic component extends around a center, wherein the material either has no ends or the ends overlap (in the radial direction or in the axial direction).

The shield may be an open metallic ring with a slot-shaped opening.

Furthermore, the extent of the shield in a projection perpendicular to the parallel layers may be less than, or equal to, the extent of the primary side of the transformer and/or the secondary side of the transformer.

In this regard, the wording that "the extent of the shield in a projection perpendicular to the parallel layers is less than or equal to the extent of the primary side of the transformer and/or the secondary side of the transformer", as used throughout the description and the claims, is to be understood, in particular, as referring to an arrangement in which the outer edge of the shield does not protrude beyond the outer edge of the primary and/or secondary side, or in which the primary side and/or the secondary side is exactly or not completely covered by the shield (in the projection direction).

Furthermore, the features described in connection with the arrangements may also be features of a method in which an arrangement is used.

BRIEF DESCRIPTION OF THE DRAWINGS

The invention will be explained in more detail in the following detailed description based on exemplary embodiments, wherein reference is made to the drawings in which.

In the drawings, the same or functionally similar elements are indicated by the same reference numerals.

MODES FOR CARRYING OUT THE INVENTION

Figure 1:
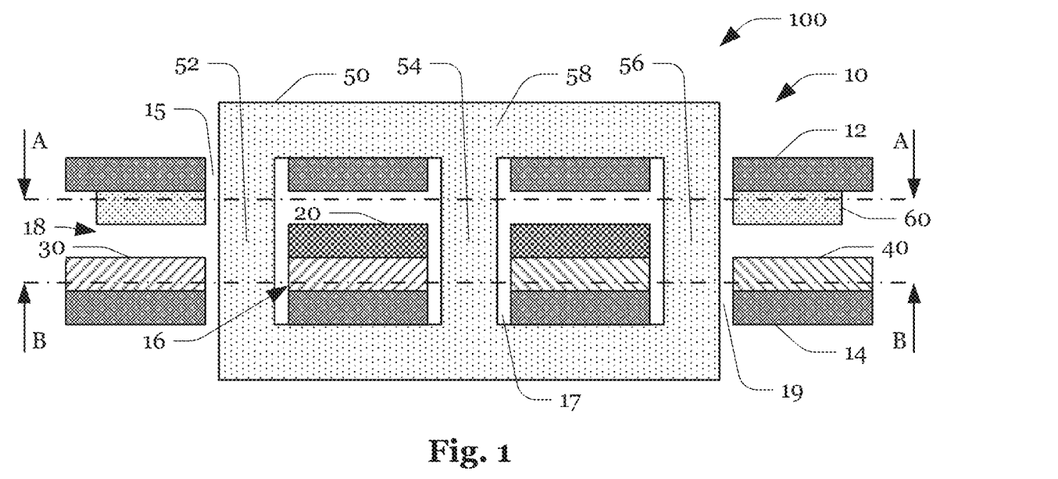
FIG. 1 shows a first sectional view of an electrical arrangement according to a first exemplary embodiment.

FIG. 1 shows a sectional view of an electrical arrangement according to an embodiment. Electrical arrangement 100 comprises printed circuit board 10 (only partially shown) which consists of layers 12 and 14 that are parallel to each another. Laterally spaced apart openings 15, 17, and 19 extend through layers 12 and 14. Between layer 12 and layer 14, there is a transformer. The transformer comprises coil winding 20, which form the primary side of the transformer, and coil windings 30 and 40, which form the secondary side of the transformer. As shown, coil windings 30 and 40 (in layer 16) can be arranged side-by-side. Furthermore, as shown in FIG. 1, the primary side and the secondary side may be arranged in immediately adjacent layers 16 and 18.

Electrical arrangement 100 further comprises magnetic conductor 50 which, in the sectional view of FIG. 1, has the shape of a horizontal figure of eight, wherein magnetic conductor 50 has vertically extending sections (hereinafter referred to as legs) 52, 54 and 56 which penetrate circuit board 10 and pass through openings 15, 17, and 19, respectively. Coil winding 30 winds (only) around outer leg 52, coil winding 40 winds (only) around outer leg 56 and coil winding 20 winds (only) around inner leg 54. Electrical arrangement 100 further comprises shield 60 which is also arranged between layer 12 and layer 14 and winds around both outer legs. In further embodiments, shield 60 may also be arranged above layer 12 or below layer 14 and, in particular, extend around magnetic conductor 50. Shield 60 may be formed as a shield winding or as a homogeneous layer. For example, shield 60 may be formed by conductive tracks on a substrate (for example, a non-conductive foil) or by a continuously conductive layer (for example a conductive foil such as a copper foil).

Figure 2:
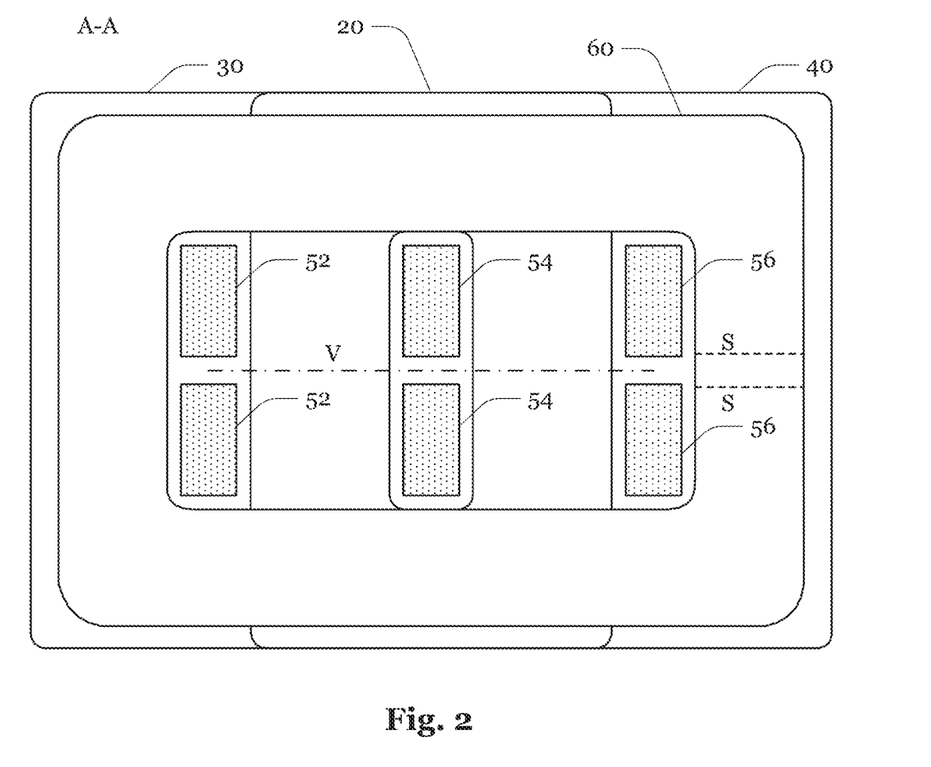
FIG. 2 shows a second sectional view of the electrical arrangement according to the first exemplary embodiment.
Figure 3:
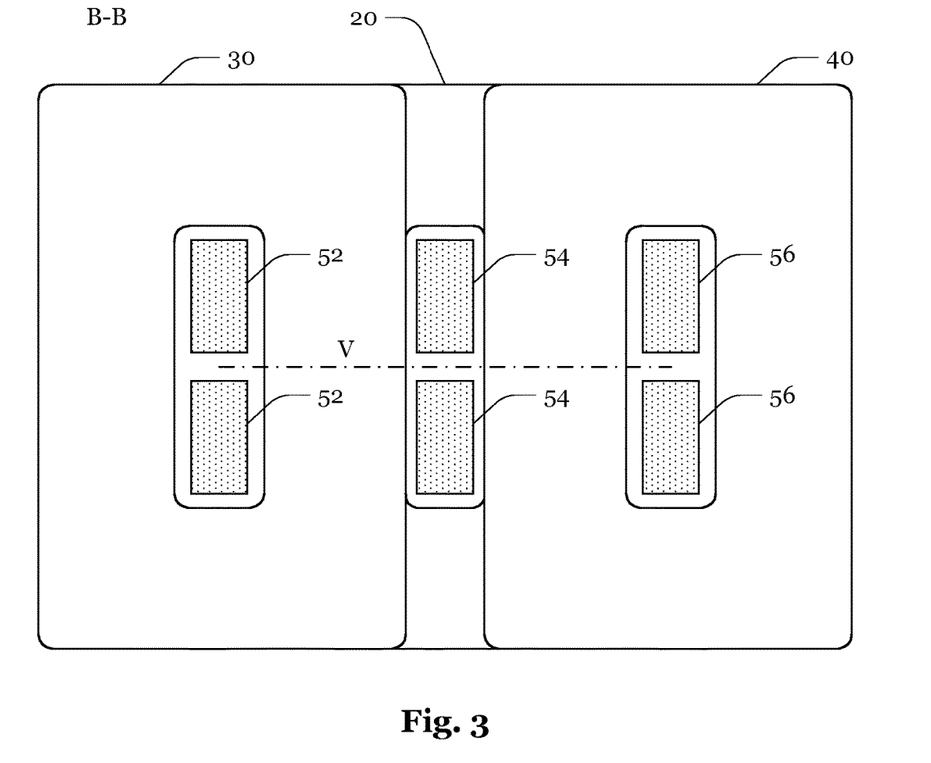
FIG. 3 shows a third sectional view of the electrical arrangement according to the first exemplary embodiment.

As shown in FIG. 2 and FIG. 3, magnetic conductor 50 may consist of two (structurally identical) parts, the yokes 58 of which extend parallel to a line V which connects two or three centers of the openings 15, 17, and 19. In particular, the connecting line V in the sectional views shown in FIG. 2 and FIG. 3 may lie in a plane to which the parts of the magnetic conductor are mirror symmetrical. As shown, shield 60 may be formed as a completely closed ring. In addition, as indicated by the dashed lines marked with the letter S, shield 60 may be formed as an open ring with a slot-shaped opening.

As shown, coil windings 20, 30, and 40 may extend farther than shield 60 such that the coil windings are not completely covered by shield 60 in a projection perpendicular to the parallel layers. In other embodiments, coil windings 20, 30 and 40 may have the same extent or a smaller extent than shield 60. Coil winding 20, coil winding 30, and coil winding 40 may furthermore have (substantially) the same thickness. Furthermore, shield 60 may have a thickness which is (essentially) the same as the thickness of coil winding 20, coil winding 30, and coil winding 40.

Figure 4:
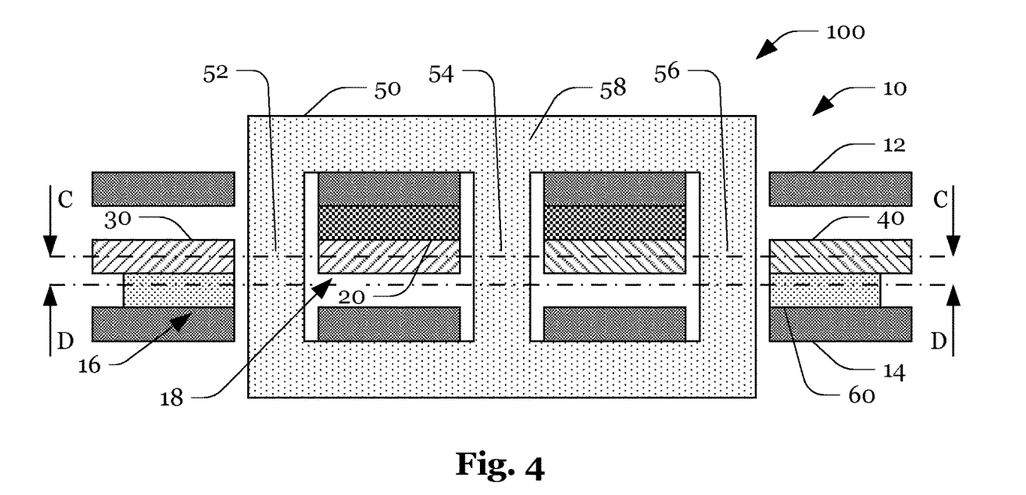
FIG. 4 shows a first sectional view of an electrical arrangement according to a second exemplary embodiment.
Figure 5:
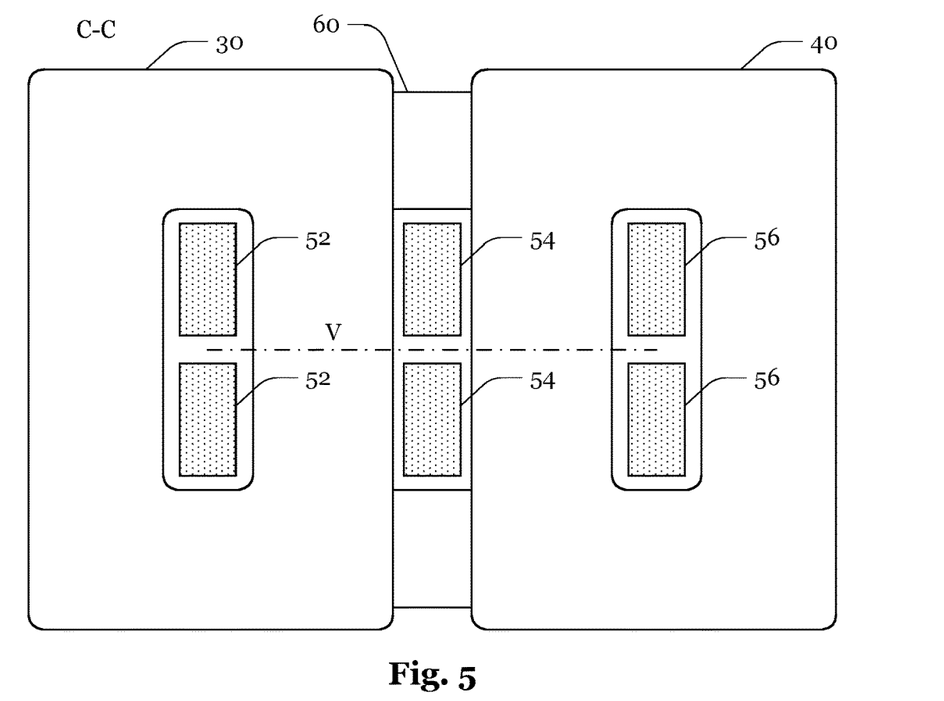
FIG. 5 shows a second sectional view of the electrical arrangement according to the second exemplary embodiment.
Figure 6:
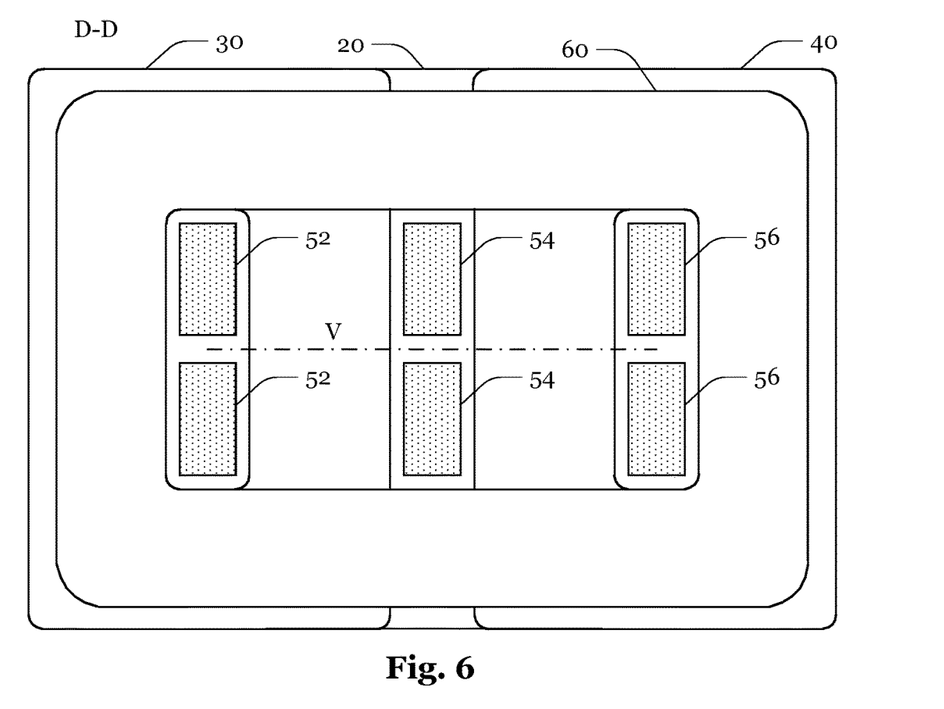
FIG. 6 shows a third sectional view of the electrical arrangement according to the second exemplary embodiment.

FIG. 4, FIG. 5, and FIG. 6 show a modification of the electrical arrangement shown in FIG. 1, FIG. 2, and FIG. 3, which differs from electrical arrangement 100 shown in FIG. 1, FIG. 2, and FIG. 3 in that coil winding 30 and coil winding 40 of the secondary side are arranged between coil winding 20 of the primary side and shield 60, whereas in FIG. 1, FIG. 2, and FIG. 3, coil winding 20 of the primary side is arranged between shield 60 and coil windings 30 and 40 of the secondary side. In further possible embodiments, the order of the layers may also be the other way around, so that, deviating from FIG. 4, shield 60 is arranged on top (i.e., on the upper side of the transformer) and coil winding 20 is arranged at the bottom (i.e., at the lower side of the transformer).

Figure 7:
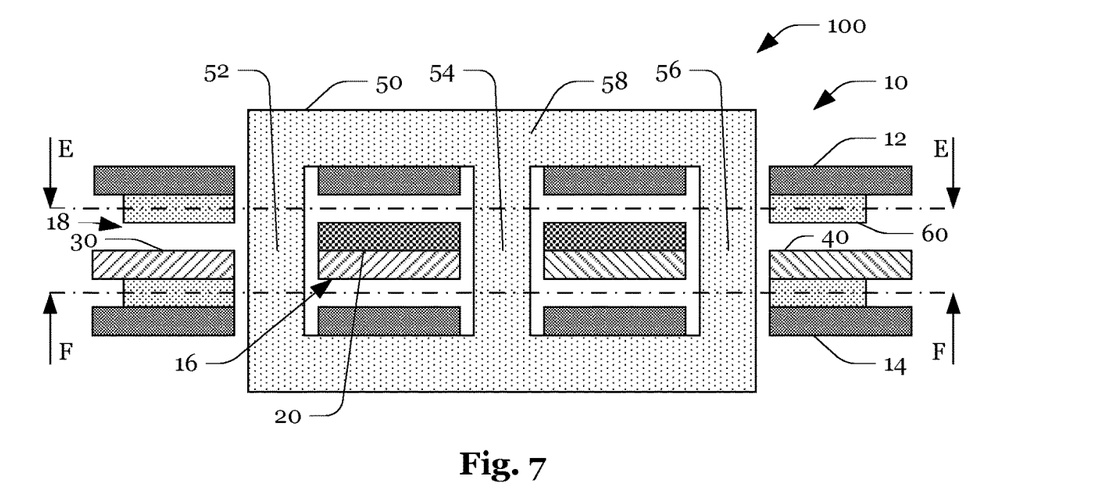
FIG. 7 shows a first sectional view of an electrical arrangement according to a third exemplary embodiment.
Figure 8:
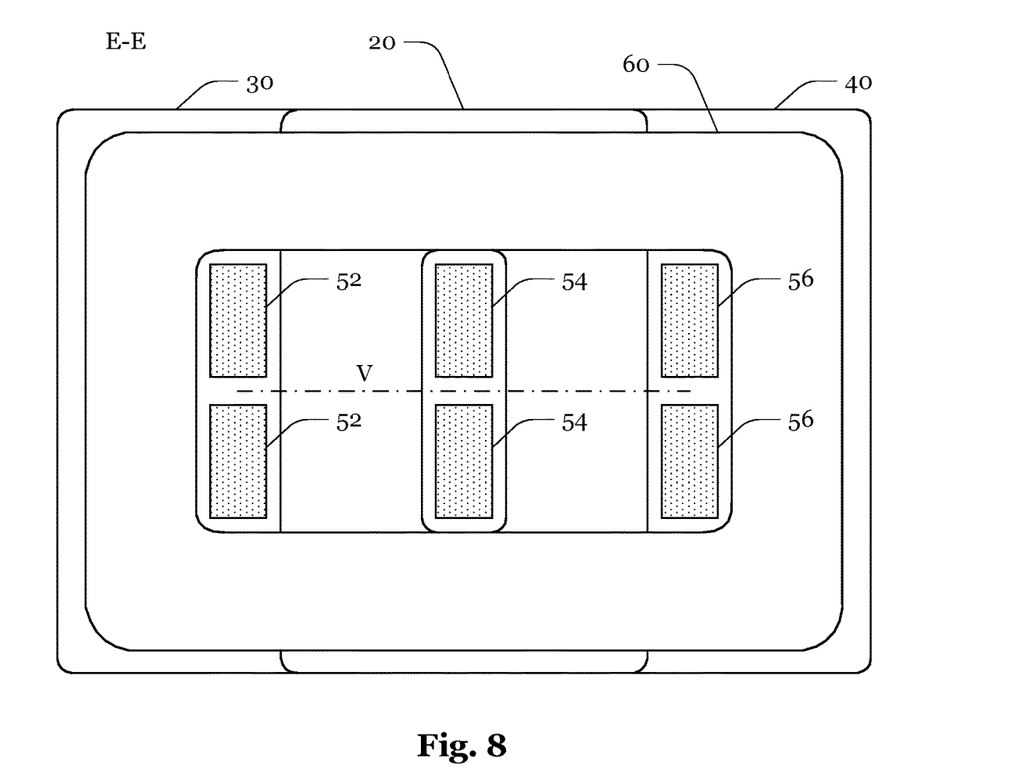
FIG. 8 shows a second sectional view of the electrical arrangement according to the third exemplary embodiment.
Figure 9:
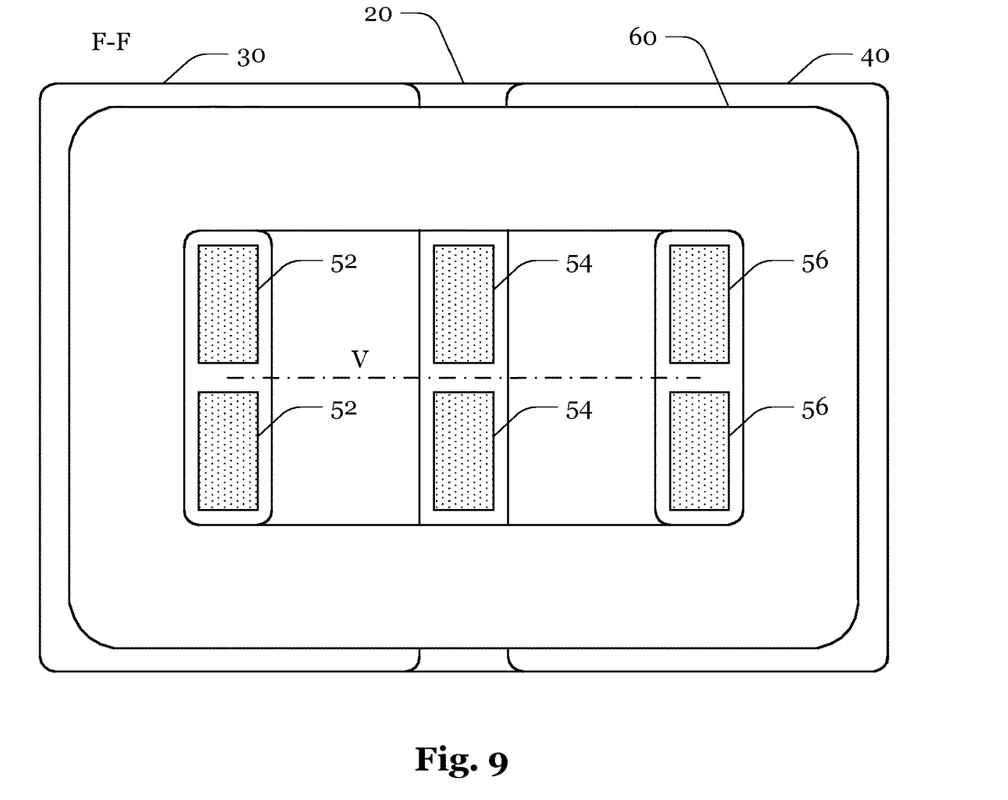
FIG. 9 shows a third sectional view of the electrical arrangement according to the third exemplary embodiment.

FIG. 7, FIG. 8, and FIG. 9 show a modification of the electrical arrangements shown so far, which differs from the electrical arrangements shown so far in that coil winding 20 of the primary side and coil winding 30 and coil winding 40 of the secondary side are arranged between two shields 60. The shields may be structurally identical or have (essentially) the same dimensions and, as shown, be arranged such that they are mapped onto one another in a projection perpendicular to parallel layers 12 and 14. In further possible embodiments, one shield may be larger than the other shield, or one of the shields may be divided into two (partial) shields (for example an inner and an outer shield).

Figure 10:
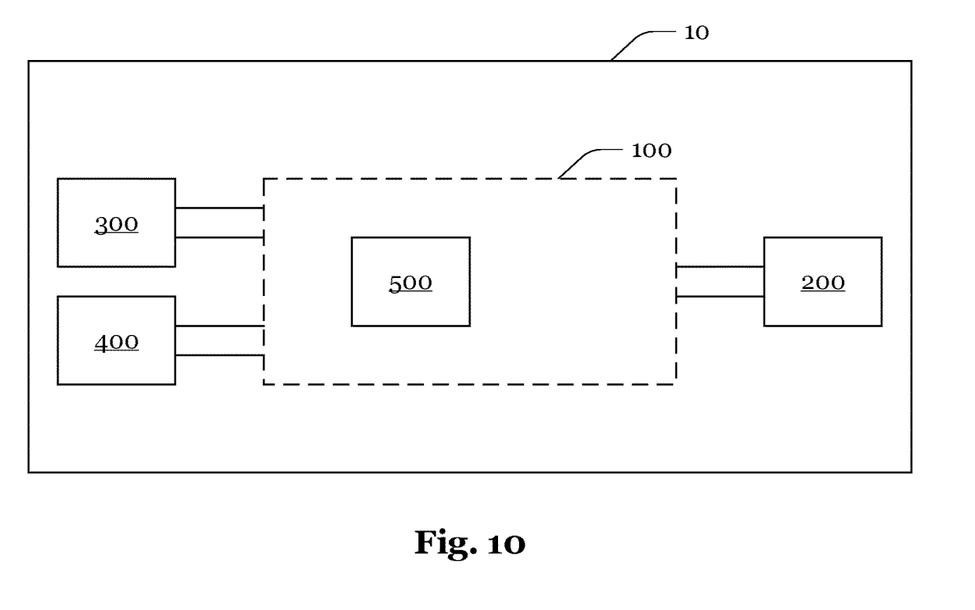
FIG. 10 shows a top view of the electrical arrangements according to a further exemplary embodiment.

FIG. 10 shows a top view of printed circuit board 10, which is equipped with electrical components 200, 300, 400, and 500. Component 200 is electrically connected to the primary side and components 300 and 400 are electrically connected to the secondary side. Component 500 is arranged above the transformer so that it overlaps with the transformer in a projection perpendicular to the parallel layers. In further possible embodiments, one or more of the components 200, 300, 400 may be arranged above the transformer and interact electrically and/or magnetically with the transformer.

LIST OF REFERENCE SIGNS

10 circuit board
12 circuit board layer
14 circuit board layer
16 circuit board layer
18 circuit board layer
20 coil winding
30 coil winding
40 coil winding
50 magnetic conductor
52 leg
54 leg
56 leg
58 yoke
60 shield
100 arrangement
200 component
300 component
400 component
500 component
V connecting line
S slot

The invention claimed is:

1. An electrical circuitry with a printed circuit board built up in parallel layers, comprising:
a shield having a shield opening;
a transformer for transmitting signals from a primary side to a secondary side with a first coil winding, a second coil winding, and a third coil winding, the first coil winding forming the primary side of the transformer and the second and third coil windings forming the secondary side of the transformer, wherein the printed circuit board has at least one first layer and the second and third coil windings are arranged within the first layer and wherein the circuit board has at least one second layer and the first coil winding is arranged in the second layer, the first coil winding being vertically aligned with at least a portion of the second coil winding and with at least a portion of the third coil winding when the second coil winding and the third coil winding are in horizontal alignment, the second coil winding being spaced apart from the third coil winding; and
a magnetic conductor comprising two parts that are in horizontal alignment when the second coil winding and the third coil winding are in horizontal alignment, each of the two parts being separate from each other and each having a first leg, a second leg, and a third leg that are each spaced apart from each other, the second coil winding being wound around the first leg of each of the two parts but not wound around the second leg of the two parts, the third coil winding being wound around the third leg of each of the two parts but not wound around the second leg of the two parts, and the first coil winding being wound around the second leg of each of the two parts but not wound around the first leg or the third leg of the two parts, wherein the two parts of the magnetic conductor are at least partially disposed within the shield opening so as to be encircled by the shield,
wherein the circuit board has openings which are penetrated by the legs of the two parts of the magnetic conductor,
wherein the magnetic conductor, the shield, and the transformer are magnetically coupled, and
wherein the shield is a potential-free shield.

2. The electrical circuitry of claim 1, wherein the shield is a shield winding.

3. The electrical circuitry of claim 1, wherein the first and second layers are immediately adjacent to each other.

4. The electrical circuitry of claim 1, wherein the shield is arranged in a third layer of the circuit board which is immediately adjacent to the second or first layer.

5. The electrical circuitry of claim 1,
wherein a first part of the shield is arranged in a third layer of the circuit board and a second part of the shield is arranged in a fourth layer of the circuit board,
wherein the third layer is immediately adjacent to the second or first layer.

6. The electrical circuitry of claim 1,
wherein the circuit board has an uppermost layer which is equipped with components and/or a lowermost layer which is equipped with components, and
wherein the components interact with the transformer electrically and/or magnetically.

7. The electrical circuitry of claim 6, wherein the components at least partially overlap with the transformer in a projection perpendicular to the parallel layers.

8. The electrical circuitry of claim 1, wherein the first and/or second and/or third coil winding encloses one or more of the openings of the circuit board.

9. The electrical circuitry of claim 1, wherein the first legs, the second legs, and the third legs of the two parts are each separated by a first slot, a second slot, and a third slot, respectively, centers of first slot, second slot, and third slot lie on a linear connecting line.

10. The electrical circuitry of claim 9, wherein the two parts of the magnetic conductor extend parallel to the connecting line.

11. The electrical circuitry of claim 8, wherein centers of the openings in the circuit board form an isosceles or equilateral triangle.

12. The electrical circuitry of claim 1, wherein the shield is a completely closed metallic ring that encircles the shield opening.

13. The electrical circuitry of claim 1, wherein the shield is an open metallic ring with a slot-shaped opening.

14. The electrical circuitry of claim 1, wherein the second legs of the magnetic conductor are disposed between the first legs and the third legs.

15. The electrical circuitry of claim 14, wherein the first leg, the second leg, and the third leg of each part of the magnetic conductor are each laterally spaced apart and are each disposed on a laterally extending linear line.

16. The electrical circuitry of claim 14, wherein the first leg, the second leg, and the third leg of each part of the magnetic conductor are each laterally spaced apart and are disposed in parallel alignment.

17. The electrical circuitry of claim 14, wherein the first coil winding is disposed immediately adjacent to the second coil winding and the third coil winding with no shielding therebetween.

18. The electrical circuitry of claim 1, wherein the second coil winding is not wound around the third legs and the third coil winding is not wound around the first legs.

19. The electrical circuitry of claim 1, further comprising:
a first circuit connected to the second coil winding; and
a second circuit connected to the third coil winding and being different from the first circuit.

20. The electrical circuitry of claim 1, wherein the two parts of the magnetic conductor are identical.

21. The electrical circuitry of claim 1, wherein the shield overlays at least a portion of the first coil winding, the second coil winding, and the third coil winding when the second coil winding and the third coil winding are horizontally aligned.

* * * * *